United States Patent [19]

Nakata et al.

[11] Patent Number: 4,903,070
[45] Date of Patent: Feb. 20, 1990

[54] IMAGE RECORDING APPARATUS

[75] Inventors: Takashi Nakata, Nagoya; Takashi Tomizawa, Aichi; Shigeyuki Hayashi, Nagoya; Motoshi Ohno, Nagoya; Yoichi Horaguchi, Nagoya, all of Japan

[73] Assignee: Brother Kogyo Kabushiki Kaisha, Aichi, Japan

[21] Appl. No.: 300,841

[22] Filed: Jan. 24, 1989

[30] Foreign Application Priority Data

Jan. 29, 1988 [JP] Japan .................................. 63-11875

[51] Int. Cl.⁴ ............................................ G03B 15/00
[52] U.S. Cl. ...................................... 355/27; 355/309
[58] Field of Search ......................... 355/27, 309, 311

[56] References Cited

U.S. PATENT DOCUMENTS 4,427,287  1/1984  Matsumoto et al. ............ 355/309 X
4,436,406  3/1984  Murasaki et al. .................... 355/309
4,816,873  3/1989  Hatta ..................................... 355/27

Primary Examiner—Donald A. Griffin
Attorney, Agent, or Firm—Oliff & Berridge

[57] ABSTRACT

An image recording apparatus for recording an image on a developer sheet. The apparatus includes an exposure unit, a pressure developing unit and thermal fixing unit. The developer sheet is fed through a sheet path extending from a developer sheet cassette to the pressure developing unit where the sheet is superposed with a microcapsule sheet carrying a latent image, and these sheets are pressed together. To avoid diagonal feeding of the developer sheet to the pressure developing unit or to avoid image recordation on the developer sheet having improper size, such undue developer sheet can be detected and is fed toward the outside at toward the outside at the upstream side of the pressure developing unit. For this, there is provided a detecting means, a branch path and sheet change over means these being positioned close to the sheet path.

7 Claims, 3 Drawing Sheets

IMAGE RECORDING APPARATUS

BACKGROUND OF THE INVENTION

The present invention relates to an image recording apparatus such as a copying machine or a printer in which a photosensitive recording medium is employed. Further, relating U.S. patent applications have been filed bearing Ser. No. 07/281,336 (corresponding to Japaneses Utility Model Application No. 62-189349) filed on December 8, 1988, 07/281,215 (corresponding to Japanese Utility Model Application Nos. 62-191014 and 63-17646) filed on December 8, 1988, and 281,327 (corresponding to Japanese Utility Model Application Nos. 62-189350, 62-191005 & 62-191013) filed on December 8, 1988.

Generally, an image recording apparatus of this kind includes an exposure unit for exposing a photosensitive recording medium to light, a developing unit for image-developing the light-exposed medium, and a transfer means for transferring the light exposed medium to the developing unit. The exposure unit includes a light source such as a halogen lamp, a reflector and a reflection mirror, and the developing unit includes a pressure developing means. The photosensitive recording medium is exposed to light at the exposure unit for forming a latent image corresponding to an original on the recording medium. The recording medium carrying the latent image is then transferred by the transfer means to the developing unit where the latent image is converted into a visible image.

The photosensitive recording medium is of a transfer type recording medium which comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure sensitive recording medium provided with microcapsules which encapsulate therein a fist material (chromogenic material or dye precursor) having first and second phases dependent on light exposure. The second image recording medium comprises the developer medium provided with a second material (developer material) which provides an output image upon reaction with the first material. Such image recording medium is disclosed in, for example, U.S. Pat. No. 4,399,209.

The image recording apparatus disclosed in the above described copending U.S. patent applications is shown in FIG. 1 which shows a copying machine capable of performing a full-color copying. This copying machine employs the transfer type image recording mediums as described above.

As shown in FIG. 1, the copying machine 40 generally includes an exposure unit 19 having an exposure stand 19A and a pressure developing unit 20.

Further, a light shielding partition plate 36 is disposed in the apparatus to spacedly divide the apparatus into, two chambers X and Y. That is, an optical system bridging from the light source to the exposure unit 19 is disposed within the chamber Y whereas other requisite units such as the pressure developing and thermal fixing units are disposed within the chamber X.

The elongated web-like microcapsule sheet 37 is wound around a cartridge shaft 14, and is retained in a microcapsule sheet cartridge 13 that is detachably disposed at a position immediately below an original support stand glass 2 and is formed with a bottom opening 13A. The exposure unit 19 is disposed below the sheet cartridge 13 at a downstream side therof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed roller 15 and a barrel roller 17 are rotatably provided at a vertical sheet path for guide travel of the sheet toward the exposure unit. At the downstream side of the exposure unit 19, there is provided the pressure developing unit 20 which includes a small diameter roller 21 and a backup roller 31.

At a lower portion of the apparatus 40, there is provided a developer sheet cassette 32 for storing therin a stack of developer sheets 38. Immediately above the cassette 32, a sector roller 33 is provided to feed each one of developer sheets 38 toward the pressure developing unit 20. Between the cassette 32 and the pressure developing unit 20, a roller 34 and a resist-gate 35 are provided so as to align leading edge of the developer sheet 38.

At the downstream side of the pressure developing unit 20, a pair of feed rollers 22 are provided so as to provide constant running speed of the microcapsule sheet 37. This speed is coincident with a horizontally moving speed of an original support stand glass 2 (described later). At the downstream side of the feed rollers 22, a separation roller 23 is provided at which the microcapsule sheet 37 is separated from the developer sheet 38. The separate microcapsule sheet 37 is taken-up by the above mentioned take up means 25 through a meander travel control roller 24. On the other hand, thermal fixing unit 30 is provided at the downstream side of the separation roller 23. The thermal fixing unit 30 includes a hollow heat roller 29 in which a heater element 30A is disposed. Further, a developer sheet feed roller 28 is provided to feed the image fixed developer sheet 38 toward a discharge tray 27.

Next, an optical system and optical path in the copying machine 40 will be described. As shown in FIG. 1, the copying machine 40 has its top plate portion provided with a stand cover 1 and the original support stand glass 2. The original support stand glass 2 is formed of light transmissive material and is movable in the horizontal direction and on which a desired original (not shown) is to be placed. At the upper one side section (right side in FIG. 1) of the copying machine 40, fixedly provided is a light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leaking out of the apparatus.

To irradiate the light from the halogen lamp 3 on the original at a high efficiency, a flat reflector 5 is disposed on one side of the light source. The flat reflector 5 is adapted to reflectingly direct lights which are not directly directed toward the original from the light source and concentrate such reflected light onto the original.

At another side of the halogen lamp 3 there are provided a fan 6 and a louver 7 for introducing an external air into the apparatus. Accordingly, air is effectively impinged onto the original support glass 2.

A filter 8 is disposed below the original support stand glass 2. Further, a lens unit 9 is provided below the filter 8. Light emitted from the halogen lamp 3 and reflected at the original placed on the original support stand glass 2 passes through the filter 8 and enters the lens 9. The filter 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable.

A pair of reflection mirrors 11 and 11 are provided below the lens 9. The condensed lights passing through the lens 9 change their direction by 180 degrees (completely reverse direction) by the two reflection mirrors 11, and the thus oriented lights impinge on the microcapsule sheet 37 closely contacting the bottom of the exposure table 19A to form the latent image thereon. The two reflection mirrors 11 are securely mounted to a mirror mounting plate 12. The mirror mounting plate 12 is vertically movably connected to the main frame 41 of the apparatus 40, so that the adjustment of the length of the light path and focusing adjustment can be effected by fine adjustment of the position of the mirror mounting plate 12. The original (not shown), the filter 8, the lens 9, the pair of reflection mirrors 11 and the exposure table 19A define a U-shape or J-shape light path in combination. That is, the optical path is bent into U-shape or J-shape so as to have a first vertical path directing downwardly, a second path directing horizontally and a third path directing upwardly. At the first optical path, a light reflected from the original is oriented downwardly, and at the third path the reflected light is directed toward the imaging surface of the photosensitive pressure sensitive recording medium at the exposure zone 19, and the reflection mirror unit is disposed at the second optical path extending in horizontal direction. As a result, the mirror mounting plate 12 is adjustably movable in a direction parallel with the light path passing through the lens 9. Further, when the mirror mounting plate 12 is vertically moved by a certain length, the total light path length is increased by a length twice as large as the certain length, yet focussing position at the exposure zone is maintained unchanged, since these mirrors can be moved in a direction parallel with the optical axis.

The mirror mounting plate 12 can maintain relative angular positional relationship between the pair of mirrors 11 and 11 regardless of the vertical movement of the plate 12. Accordingly, the mirror mounting plate 12 which fixedly mounts the two mirrors serves as a single integral unit can be simply assembled to the recording apparatus 40 during assembly as the single integral unit. A pair of mirror mounting plate 12 are provided so as to secure side edges of the mirrors 11. The confronting mirror mounting plates 11 extend in vertical direction and are positioned so as not to block the light path. Furthermore, it should be noted that only the pair of reflection mirrors 11 are required so as to obtain a normal upstanding or erect imaging direction at the exposure zone, since the light is finally applied to the exposure zone upwardly, i.e, the microcapsule sheet is subjected to light irradiation at the exposure zone with the microcapsule surface facing down.

Operation of the copying apparatus will be described:

The microcapsule sheet 37 taken out through the opening 13A of the cartridge 13 is fed by the feed rollers 15 and guided by the barrel roller 17. The sheet 37 then passes in contact with a lower face of the exposure table 19A where original image carrying light is applied to the sheet 37, so that a latent image is formed on the sheet 37.

More specifically, the original support stand cover 1 is lifted up for mounting the original on the original support stand glass 2. Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is coming into confrontation with the light source. Thereafter, with the halogen lamp 3 being lighted, the original support stand glass 2 is then moved in a second direction (leftwardly in FIG. 1) opposite to the first direction. The light emitted from the halogen lamp 3 is reflected at the original, and the reflected light passes through the filter 8 and lens 9 and is reflected at two reflection mirrors 11. The last reflected light is finally directed toward the microcapsule sheet 37 which is located under the exposure table 19 to form the latent image on the sheet 37. At this time, since the microcapsule sheet 37 is moved under the exposure table 19 in the second direction (leftwardly in FIG. 1) at the same speed as the moving speed of the original support stand glass 2, the latent image corresponding to the original image is formed on the microcapsule sheet 37. Since the conveying speed for the microcapsule sheet 37 is controlled to be constant by feed rollers 22 and is set equal to the moving speed of the original support stand glass 2, line latent images having given widths are sequentially formed on the microcapsule sheet 37 that is passing along the lower surface of the exposure table 19A.

The sheet is then fed to the pressure developing unit 20 by the guide roller 17. At the pressure developing unit, the sheet 37 is pressurizingly superposed with the developer sheet 38. An unexposed portion of the microcapsule sheet 37 leaving the cartridge 13 is kept unexposed to light by the shielding cover 36. The developer sheets 38 are fed out one by one by the sector roller 33, and each sheet 38 is fed to a sheet inlet of the pressure developing unit 20 after leading edge of the sheet 38 is aligned by developer sheet rollers 34 and the resist gate 35.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsulea are ruptured by the applied pressure, to thereby form an output image on the developer sheet 38 because of the reaction of chromogenic material with the developer material.

In summary, in timed relation with the movement of the original support stand glass 2 in the second direction, the roller 33 feeds out the developer sheets 38 one by one from the developer sheet cassette 32. The developer sheet 37 superposed on the light-exposed microcapsule sheet 37 is fed to the pressure developing unit 20, and the latent image on the microcapsule sheet 37 is developed and transferred onto the developer sheet 38.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to thermal fixing in the thermal fixing unit 30 and is then discharged onto the discharge tray 27 with its image surface up. Meanwhile, the microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 1) of the glass 2 confronts the light source, the copying of the original is completed and the halogen lamp 3 is turned off.

According to a conventional image recording apparatus of this kind, if the image recording medium, i.e., the developer sheet is diagonally travelled into the pressure developing unit from the developer sheet cassette, desirable image developing operation may not be attainable. This drawback may also be acknowledgeable in the copending U.S. Patent Applications described above in spite of the provisions of the roller 34 and the resist gate 35. Such diagonal or skew feeding of the sheet (developer medium) may degrade quality of the visible output image. Further, sheet wrinkles and sheet jamming may occur due to the diagonal sheet feeding from the developer sheet cassette to the pressure developing unit, and therefore, continuous image recording operation may not be achievable.

SUMMARY OF THE INVENTION

It is therefore, an object of the present invention to overcome the above-described drawbacks and disadvantages, and to provide an improved image recording apparatus.

Another object of this invention is to provide such image recording apparatus in which an image recording medium having undue orientation or posture and/or having undue size is discharged outside of said apparatus without undergoing a pressure developing operation, and only a correct recording medium having correct orientation and correct size is delivered into the pressure developing unit.

To attain these objects, according to the present invention, there is provided an image recording apparatus for recording an image on an image recording medium, the image corresponding to an original image, the apparatus comprising; a main frame; an exposure unit disposed in the main frame for exposing the image recording medium to light; a pressure developing unit disposed in the main frame and positioned downstream of the exposure unit for pressure developing the image recording medium; a sheet delivery means for feeding the image recording medium to the pressure developing unit, the sheet delivery means defining a sheet path extending to the pressure developing unit; a branch path branching from the sheet path and directing toward outside of the main frame for selectively discharging the image recording medium outside of the main frame without undergoing pressure developing operation, the branch path having an inlet portion; a detecting means positioned at the sheet delivery means for detecting at least one of posture and size of the image recording medium, the detecting means generating a signal indicative of at least one of the posture and the size, and, sheet change over means movable between its first and second positions in response to the signal, the first position being directed to the branch path and the second position being directed to the pressure developing unit, the sheet change over means being positioned at the inlet portion of the branch path and movable to the first position for selectively discharging the image recording medium to the branch path when at least one of the posture and the size of the image recording medium is unduly provided.

With the structure, if the image recording medium, i.e., the developer medium is unduly oriented, for example, diagonally moved, or if the sheet size is improperly provided, such undue state of the sheet is detected by the detecting means. The sheet change over means is movable in response to the signal from the detecting means, so that such improper sheet is delivered into the branch path, and is discharged outside. Therefore, only a correct developer medium having a correct size and/or having a correct orientation is fed to the pressure developing unit and is subjected to pressure developing operation together with a photosensitive recording medium.

DETAILED DESCRIPTION OF THE INVENTION

Figure 1:
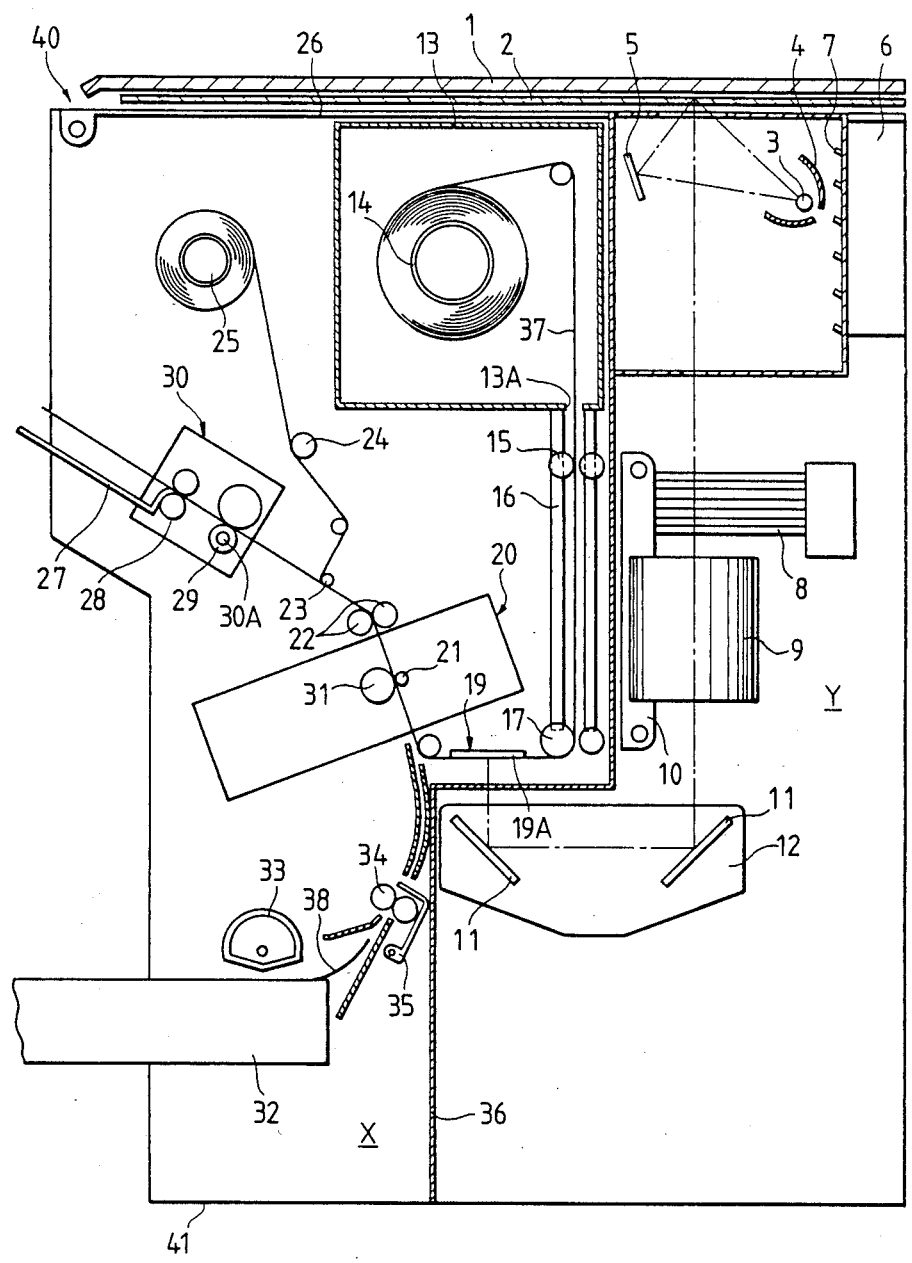
FIG. 1 is a schematic elevation showing an image recording apparatus according to a copending U.S. Patent Applications, e.g., U.S. Ser. No. 281,327.
Figure 2:
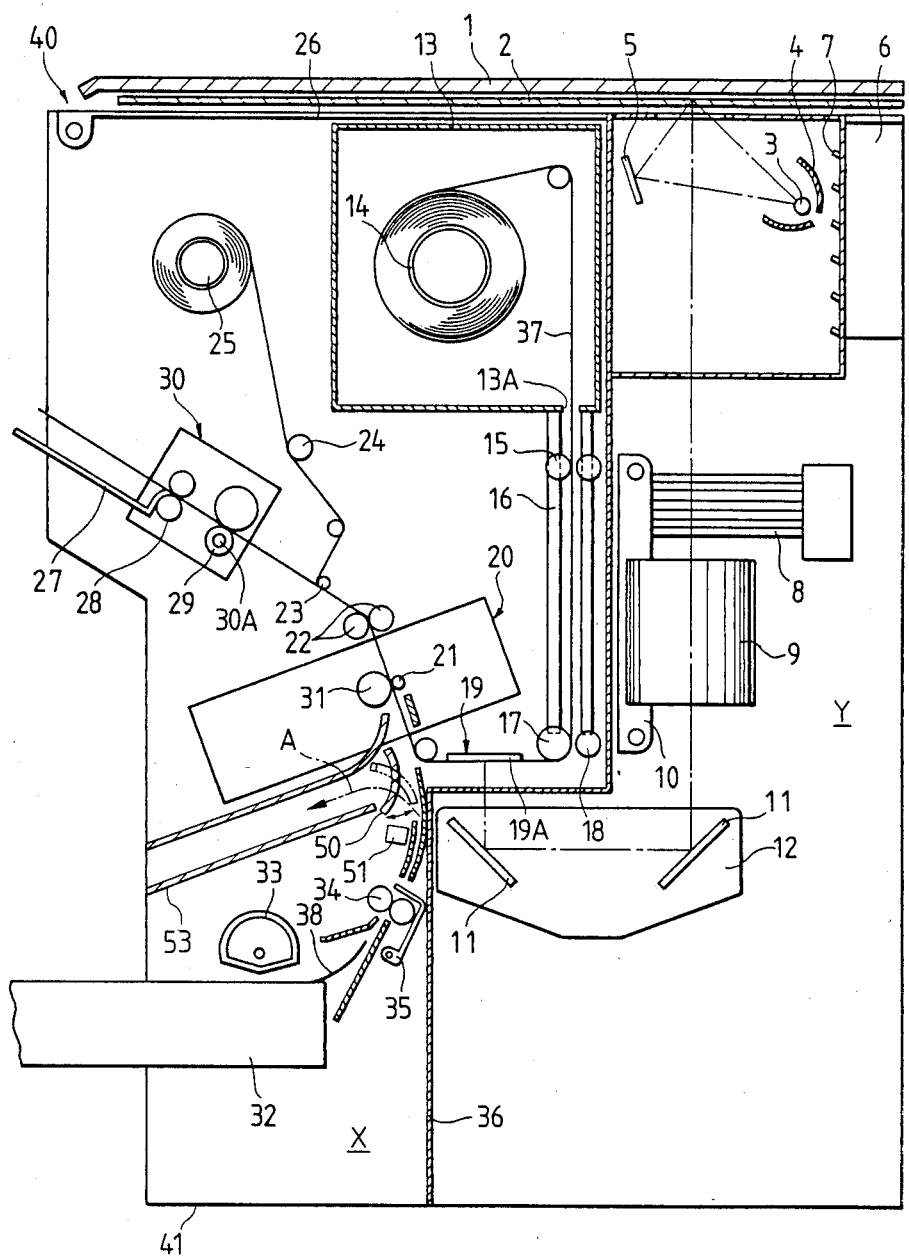
FIG. 2 is a schematic elevation showing an image recording apparatus according to the present invention.
Figure 3:
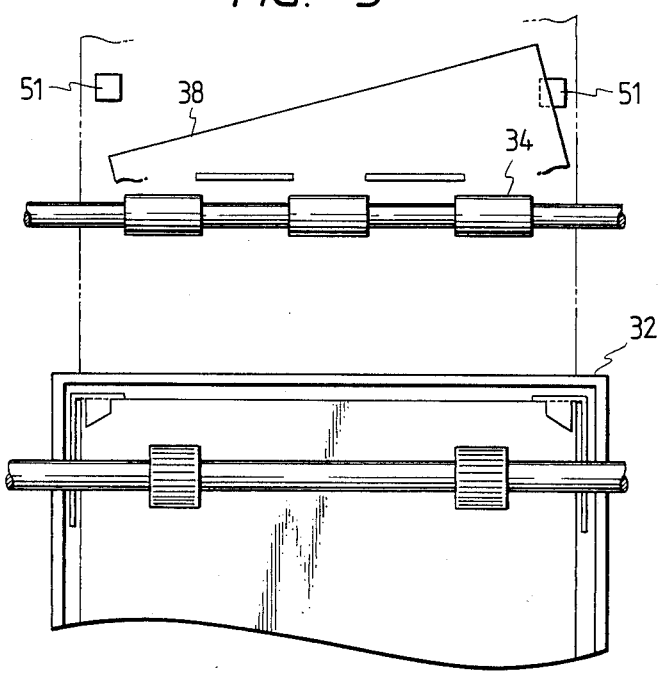
FIG. 3 is a view for description to a developer sheet which is on a sheet delivery means and which is diagonally advanced toward a pressure developing unit according to the present invention.
Figure 4:
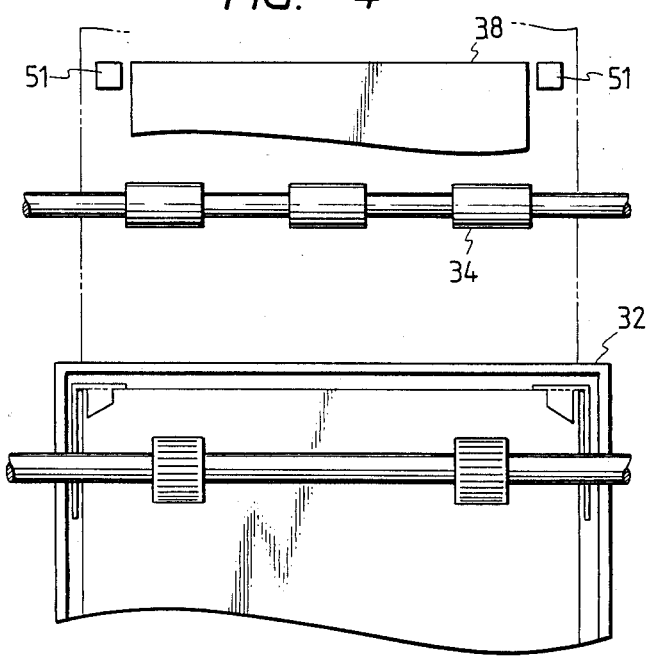
FIG. 4 is a view for description to a developer sheet which is on a sheet delivery means and whose size is smaller than a preselected size according to the present invention.

One embodiment according to the present invention is shown in FIGS. 2 thru 4. In the embodiment, like parts and components are designated by the same reference numerals and charactors as those shown in FIG. 1 for avoiding duplicate descriptions.

Inventive feature according to this embodiment resides in a developer sheet delivery means bridging between a developer sheet cassette 32 and a pressure developing unit 20 for feeding each one of developer sheets 38 toward the pressure developing unit 20. The developer sheet delivery means includes sheet edge sensors 51, a branch path 53 and a sheet change over means 50.

As described above, a sector roller or semi-cylindrical roller 33 is disposed above the developer sheet cassette 32 for supplying each one of the developer sheets 38 which is positioned at a top of a sheet stack. Rotation of the sector roller 33 is intermittently suspended by every single rotation by means of a cluch (not shown) mechanically interconnected therewith. A roller 34 is rotatably disposed at a position downstream of the sector roller 33, and a resist gate 35 is disposed at a position downstream of the roller 34 for aligning the leading edge of the developer sheet 38.

A pair of optical sensors 51 are disposed at positions immediately above the resist gate 35 for detecting side edges of the sheet 38 in order to detect a predetermined sheet width, e.g., a width corresponding to A4 sheet size. The optical sensors generate a signal indicative of a sheet which is unduly advanced toward the pressure developing unit 20. Furthermore, the branch path 53 is provided above the sensors 51 and below the pressure developing unit 20. The branch path 53 is adapted to selectively discharge a developer sheet 38 which has undue size other than A4 size. Moreover, the sheet change over means such as a change-over chute 50 is provided at a position adjacent an inlet portion of the branch path 53. The change-over chute 50 has a first position so as to selectively direct the sheet 38 toward the branch path 53 as indicated by an arrow A in FIG. 2, and has a second position for directing desirable sheet 38 toward the pressure developing unit 20. The chute 50 is normally biased at its second position by means of a coil spring (not shown). The change-over chute 50 is connected to a chute drive means (not shown) such as a motor and a solenoid. If the sheet 38 is diagonally oriented or if the sheet does not have a predetermined width, the change-over chute 50 is moved into the first position against the biasing force of the spring by means of the chute drive means in response to the signal sent from the sensors 51.

Upon depression of the operation switch button for starting copying, the sector roller 33 is singularly rotated, so that the single developer sheet 38 is delivered from the developer sheet cassette 32. The thus delivered sheet 38 is travelled into the roller 34, and the leading edge of the sheet 38 abuts the resist gate 35 for correcting diagonal travel of the sheet. When the sheet 38 is further travelled, it reaches the optical sensors 51. In this case, if both of the sensors 51 simultaneously detect side edges of the developer sheet 38, the sheet 38 is further advanced toward the pressure developing unit 20 without actuation of the change-over chute 50 which has been at its second position (see FIG. 4).

On the other hand, if an operator inadvertently accommodates undue sheets which have undue sheet size, or if the resist gate 35 did not accurately correct the diagonal orientation of the sheet 38 (see FIG. 3), only one of the sensors 51 detects the side edge of the sheet 38, or none of the detectors detects the sheet edges. If such undue sheet is introduced into the pressure developing unit 20, a high quality image may not be obtainable, or a sheet wrinkle and jamming may occur. Therefore, in the present invention, the detector 51 generates a signal to the chute drive means so as to move the change over chute 50 into the first position. Therefore, such undue sheet is not introduced into the pressure developing unit 20 but is introduced into the branch or discharge path 53. Accordingly, in the present invention, only a desirable developer sheet 38 is subjected to pressure developing operation together with the photosensitive recording medium 37.

According to the above described embodiment, the pair of optical sensors 51 are provided for detecting side edges of the sheet 38. However, numbers of the sensors can be increased or mechanical sensors are also available so far as they can detect undue posture of the sheet or undue size thereof.

Further, in the above embodiment, the change over chute 50 is normally biased to its second position where the developer sheet 38 can be travelled toward the pressure developing unit 20. However, it is also possible to normally bias the chute 50 into the first position, and selectively move the chute 50 into the second position. In the latter case, if the sheet width is excessively smaller than the desirable width, and if such sheet reaches the sensor positions, the sheet is automatically introduced into the branch path 53 without any actuation of the chute 50. That is, according to this modification, the apparatus is normally at its safty side (i.e., even by malfunctions of the sensors 51 or other associated mechanisms, undue sheet can be delivered toward outside without undergoing pressure developing operation).

As described above, according to the present invention, undue sheet which is diagonally oriented or which has undue size is not introduced into the pressure developing unit but is discharged outside of the image recording apparatus through the branch path 53. Therefore, undesirable developing operation can be obviated by only introducing desirable sheet into the pressure developing unit, which sheet has desirable size and orientation. As a result, an output image having high image quality is always obtainable.

What is claimed is:

1. An image recording apparatus for recording an image on an image recording medium, said image corresponding to an original image, said apparatus comprising;

a main frame, an exposure unit disposed in said main frame for exposing said image recording medium to light;

a pressure developing unit disposed in said main frame and positioned downstream of said exposure unit for pressure developing said image recording medium;

a sheet delivery means for feeding said image recording medium to said pressure developing unit, said sheet delivery means defining a sheet path extending to said pressure developing unit;

a branch path branching from said sheet path and directing toward the outside of said main frame for selectively discharging said image recording medium outside of said main frame without undergoing pressure developing operation, said branch path having an inlet portion;

a detecting means positioned at said sheet delivery means for detecting at least one of posture and size of said image recording medium; said detecting means generating a signal indicative of at least one of said posture and said size, and, sheet change over means movable between first and second positions in response to said signal, said first position being directed to said branch path and said second position being directed to said pressure developing unit, said sheet change over means being positioned at said inlet portion of said branch path and movable to said first position for selectively discharging said image recording medium to said branch path when at least one of said posture and said size of said image recording medium is unduly provided.

2. The image recording apparatus as defined in claim 1 wherein said image recording medium comprises a first image recording medium and a second image recording medium, said first image recording medium comprising a photosensitive pressure sensitive recording medium provided with microcapsules, said microcapsules encapsulating therein a first material having first and second phases dependent on light exposure, and said second image recording medium comprising a developer medium provided with a second material which provides an output image upon reaction with said first material.

3. The image recording apparatus as defined in claim 2 further comprising; a developer sheet cassette disposed at lower position of said main frame for accommodating therein said developer mediums; said sheet delivery means exteding from said developer sheet cassette and said pressure developing unit.

4. The image recording apparatus as defined in claim 3 further comprising; a sheet feed roller disposed downstream of said developer sheet cassette for feeding each one of said developer mediums; a resist gate disposed downstream of said sheet feed roller for aligning a leading edge of said developer medium; said detecting means being positioned immediately downstream of said resist gate for detecting said developer medium.

5. The image recording apparatus as defined in claim 4 wherein said detecting means comprises at least two optical sensors for detecting side edges of said developer medium.

6. The image recording apparatus as defined in claim 4 wherein said sheet change over means is normally biased toward said second position for normally directing said developer medium toward said pressure developing unit.

7. The image recording apparatus as defined in claim 4 wherein said sheet change over means is normally biased toward said first position for normally directing said developer medium toward the outside of said main frame.

* * * * *